(12) United States Patent
Tokumasu et al.

(10) Patent No.: US 6,617,902 B2
(45) Date of Patent: Sep. 9, 2003

(54) SEMICONDUCTOR MEMORY AND HOLDING DEVICE

(75) Inventors: Motoki Tokumasu, Austin, TX (US); Hiroshige Fujii, Akishima (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/101,694

(22) Filed: Mar. 21, 2002

(65) Prior Publication Data

US 2002/0149409 A1 Oct. 17, 2002

(30) Foreign Application Priority Data

Mar. 29, 2001 (JP) ........................................ 2001-095024

(51) Int. Cl.[7] .............................................. H03K 3/356
(52) U.S. Cl. ........................ 327/211; 327/218; 327/208
(58) Field of Search ................................. 327/199–203, 327/208, 210–215, 218, 219, 333

(56) References Cited

U.S. PATENT DOCUMENTS

| | | | | |
|---|---|---|---|---|
| 5,619,157 A | * | 4/1997 | Kumata et al. .............. | 327/203 |
| 5,789,956 A | * | 8/1998 | Mahant-Shetti et al. .... | 327/202 |
| 6,157,361 A | * | 12/2000 | Kubota et al. .............. | 345/100 |
| 6,304,123 B1 | * | 10/2001 | Bosshart ..................... | 327/212 |
| 6,437,624 B1 | * | 8/2002 | Kojima et al. .............. | 327/211 |

OTHER PUBLICATIONS

Hiroshi et al., "A Reduced Clock–Swing Flip–Flop (RCS-DFF) for 63% Power Reduction", IEEE Journal of Solid–State Circuits, vol. 33, No. 5, May 1998, pp. 807–811.*

Nikola Nedovic, et al., "Hybrid Latch Flip–Flop with Improved Power Efficiency", IEEE, 13th Integrated Circuits and System Design, 2000, pp. 211–215.

Hirotsugu Kojima, et al., "Half–Swing Clocking Scheme for 75% Power Saving in Clocking Circuitry", IEEE Journal of Solid–State Circuits, vol. 30, No. 4, Apr. 1995, pp. 432–435.

Young–Su Kwon, et al., "A New Single–Clock Flip–Flop for Half–Swing Clocking", IEICE Trans. Fundamentals, vol. E82–A, No. 11, Nov. 1999, pp. 2521–2526.

Daniel W. Dobberpuhl, et al., "A 200–MHz 64–b Dual–Issue CMOS Microprocessor", IEEE Journal of Solid–State Circuits, vol. 27, No. 11, Nov. 1992, pp. 1555–1567.

Hamid Partovi, et al., "Flow–Through Latch and Edge–Triggered Flip–Flop Hybrid Elements", IEEE, ISSCC Digest of Technical Papers, Feb. 1996, pp. 138–139.

Hiroshi Kawaguchi, et al., "A Reduced Clock–Swing Flip–Flop (RCSFF) for 63% Power Reduction", IEEE Journal of Solid–State Circuits, vol. 33, No. 5, May 1998, pp. 807–811.

Jin–Cheon Kim, et al., "A Low–Power Half–Swing Clocking Scheme for Flip–Flop with Complementary Gate and Source Drive", IEICE Trans. Electron., vol. E82–C, No. 9, Sep. 1999, pp. 1777–1779.

* cited by examiner

Primary Examiner—Terry D. Cunningham
Assistant Examiner—Long Nguyen
(74) Attorney, Agent, or Firm—Oblon, Spivak, McClelland, Maier & Neustadt, P.C.

(57) ABSTRACT

A semiconductor holding device comprises a first transistor circuit including a P type first transistor connected to a first power source, an N type second transistor connected to the first transistor and an N type third transistor connected to the second transistor and a second power source, and a second transistor circuit including a P type fourth transistor connected to the first power source, an N type fifth transistor connected to the fourth transistor and an N type sixth transistor connected between the fifth transistor and the second power source, an input signal being supplied to gates of the P type first transistor and the N type second transistor, a clock signal being supplied to gates of the N type third and sixth transistors, a node of the first and second transistors being connected to gates of the fourth and fifth transistors, and a node of the fourth and fifth transistors serving as an output node.

20 Claims, 5 Drawing Sheets

SEMICONDUCTOR MEMORY AND HOLDING DEVICE

CROSS-REFERENCE TO RELATED APPLICATIONS

This application is based upon and claims the benefit of priority from the prior Japanese Patent Application No. 2001-095024, filed Mar. 29, 2001, the entire contents of which are incorporated herein by reference.

BACKGROUND OF THE INVENTION

1. Field of the Invention

The present invention relates to a semiconductor holding device capable of realizing low power consumption in a clock system circuit, such as a latch circuit and a flip-flop circuit, and an integrated circuit including the semiconductor holding device.

2. Description of the Related Art

In recent years, low power consumption techniques have become important due to the demands of portable devices, in particular, and it becomes important to suppress the power consumption without decreasing the processing speed. The power consumption of the clock system circuit of a semiconductor integrated circuit accounts for a high percentage of the total power consumed by an integrated circuit. This may be as large as several tens of percent depending upon products. This is substantially equal to the power consumption of the parts other than the clock system circuit. The possible cause that the clock circuit occupies large portion of the power consumption of the semiconductor integrated circuit is based on that transition probability of a part other than the clock system circuit is about 30% generally whereas the transition probability of the clock system circuit is 100%. Furthermore, nearly 90% of the power consumption of this clock system circuit are occupied by the semiconductor holding device of the last stage (latch circuit or flip-flop circuit), a clock system circuit driving the memory and holding device, and wiring connecting between the memory and holding device and the clock system circuit. It contributes to low power consumption of the whole integrated circuit greatly and is very important to reduce the power consumption in the last stage of the clock system circuit from the above reason.

It is an object of the present invention to provide a semiconductor holding circuit which is operable with a reduced clock-swing signal.

BRIEF SUMMARY OF THE INVENTION

According to an aspect of the invention, there is provided a semiconductor holding device comprising:

a first transistor circuit including a P type first transistor connected to a first power source, an N type second transistor connected to the first transistor and an N type third transistor connected to the second transistor and a second power source; a second transistor circuit including a P type fourth transistor connected to the first power source, an N type fifth transistor connected to the fourth transistor and an N type sixth transistor connected between the fifth transistor and the second power source; and a clock generator which generates a small swing clock to be supplied to gates of the N type third and sixth transistors, an input signal being supplied to gates of the P type first transistor and the N type second transistor, a node of the first and second transistors being connected to gates of the fourth and fifth transistors, and a node of the fourth and fifth transistors serving as an output node.

DETAILED DESCRIPTION OF THE INVENTION

The First Embodiment

Figure 1:
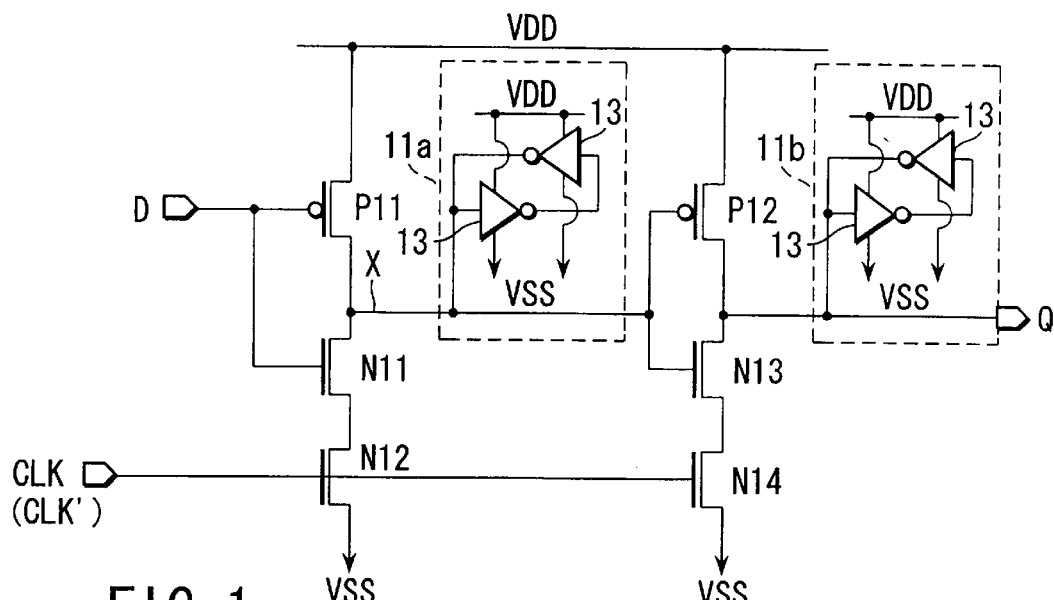
FIG. 1 shows a circuit diagram of a semiconductor holding device related to the first embodiment of the present invention.

FIG. 1 shows a latch circuit as the semiconductor holding device of the first embodiment of the present invention. This latch circuit has a two-stage configuration. The first stage comprises a PMOS transistor P11 and two NMOS transistors N11 and N12 which are connected in serial between a first power source (VDD) and a second power source (VSS). A data input signal D is input to the gates of the PMOS transistor P11 and NMOS transistor N11, and a clock signal CLK supplied by an external device (not shown) is input to the gate of the NMOS transistor N12. The first node X becomes an output node of the first stage.

The second stage comprises a PMOS transistor P12 and two NMOS transistors N13 and N14 connected in series between the first power source (VDD) and the second power source (VSS). A signal of the node X corresponding to the output node of the first stage is input to gates of the PMOS transistor P12 and NMOS transistor N13. A clock signal CLK supplied by the external device is input to the gate of the NMOS transistor N14. A node Q becomes the output node of the latch circuit. Further, in order to hold the level of the nodes X and Q when reduced clock-swing signal CLK'=0 and D=1 or CLK'=0 and X=1, level hold circuits 11a and 11b comprising two inverter circuits 13 are added to the nodes X and Q respectively. It is noted that H level is 1, and L level is 0.

There will now be described the operation of the above latch circuit operation.

The NMOS transistors N12 and N14 are rendered ON when a clock signal CLK=1. Therefore, the first stage is equivalent with a CMOS inverter circuit which receives a data input signal D, and has a node X as an output. Similarly, the second stage is equivalent to an inverter circuit having a node X as an input and an output node Q as an output. Therefore, the value of the data input signal D is output to the output node Q as it is, when CLK=1. When CLK=0, the NMOS transistors N12 and N14 are rendered OFF together. Therefore, when the output node Q=1, a path to discharge charge from this node is not formed, and thus Q=1 state is held. When Q=0, a path to discharge charge from the node X is not formed for the same reason as Q=1, so that the X=1 state is held. As a result, since PMOS transistor P12 is always in an OFF state, a path to charge the node X is not formed. Thus, Q=0 state is maintained. Accordingly, when CLK=0, the value of the output node Q is held. As a result, the period of CLK=1 is a data passage period, and the period of CLK'=0 becomes a data holding period. In other words, a latch operation is realized.

Figure 2:
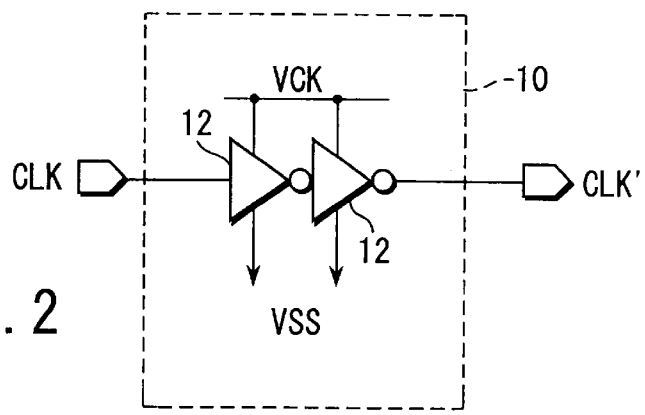
FIG. 2 shows a circuit diagram of a clock driver used for the semiconductor holding device.

FIG. 2 shows a block diagram of the clock driver 10. This clock driver 10 is a circuit for generating a reduced clock-swing signal. The clock driver 10 comprises two inverters 12 connected in cascade and uses VSS and VCK (<VDD) as a supply voltage. This clock driver 10 converts the clock signal CLK (swing: VSS-VDD) supplied from the outside into the reduced clock-swing signal CLK' (swing: VSS-VCK). The reduced clock-swing signal CLK' has a level that is not less than the threshold level of the NMOS transistor and activates the NMOS transistor.

Even if this reduced clock-swing signal CLK' is input to the semiconductor holding device of FIG. 1 instead of the clock signal CLK, all the transistors supplied with the reduced clock-swing signal CLK' can be rendered ON/OFF. Since the reduced clock-swing signal may be a signal of a swing of one kind, such as swing VSS-VCK, control is enabled in a simple circuit comprised by the inverter 12 using the potential VCK of the clock driver 10 as a supply voltage.

Figure 3:
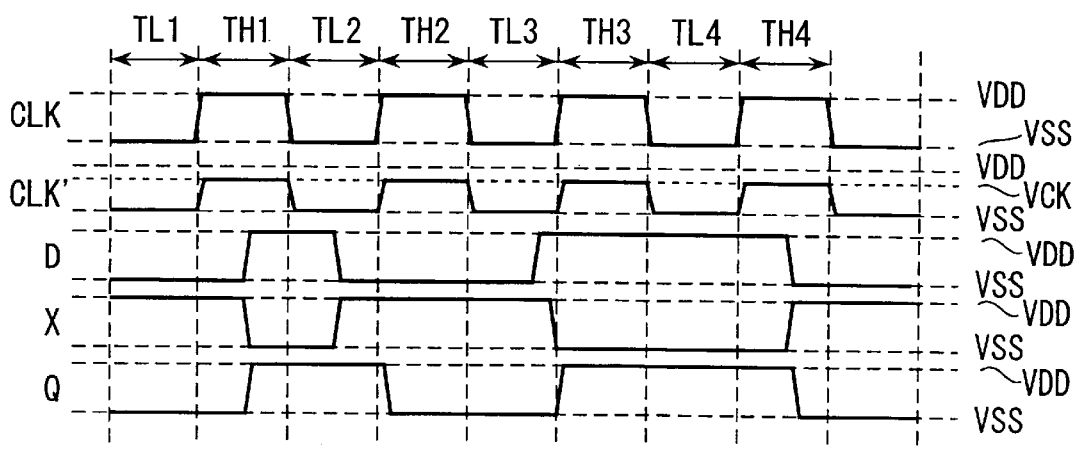
FIG. 3 shows a timing chart of operating the circuit of FIG. 1 with a reduced clock-swing signal CLK'.

FIG. 3 shows a timing chart of operating the latch circuit shown in FIG. 1 with the reduced clock-swing signal CLK'. The operation of the circuit of FIG. 1 is explained in detail referring to this timing chart. The clock signal CLK alternately repeats the low level periods TL1 to TL4 and the high level periods TH1 to TH4 every half-cycle, as shown in FIG. 3. At first the clock signal CLK of the swing VDD is converted to the reduced clock-swing signal CLK' of the swing VCK (<VDD) by the clock driver 10, and input to the NMOS transistors N12 and N14. Since the data input signal D=0 in the period TL1, the PMOS transistor P11 is rendered ON to make node X=1. In other words, the PMOS transistor P11 makes up the first logical operation unit to change the value of the node X. When the NMOS transistors N12 and N14 are rendered ON in the period TH1, circuits comprising transistors P11 and N11 and transistors P12 and N13 are equivalent to those of an inverter. Therefore, the transition from 0 to 1 of the data input signal D sets off a transition from 0 to 1 of node X, and a transition from 0 to 1 of the output node Q.

Since the data input signal D changes from 1 to 0 in the period TL2, the PMOS transistor P11 changes from OFF to ON. The node X changes from 0 to 1 and the NMOS transistor 13 changes from OFF to ON. In this time, since the NMOS transistor N14 is rendered OFF, the output node Q=1 is maintained. When the NMOS transistor N14 is rendered ON in the period TH1, the charge of the output node Q is discharged and the output node changes from 1 to 0.

The data input signal D changes from 0 to 1 in the period TL3, but the value of the node X is held (for this reason the value of the output node Q is held, too) because the NMOS transistor N12 is OFF. Since the NMOS transistor N12 is rendered ON in the period TH3 and the NMOS transistor N11 is rendered ON, too, the node X is discharged so that the output node changes from 1 to 0. As a result, the PMOS transistor P12 is rendered ON so that the output node Q changes from 0 to 1. In other words, the NMOS transistor N11 is referred to as the second logical operation circuit to change the value of the node X. The transition of the data input signal D is propagated to the output node Q as is in the period T H 4 as in the period TH1. Because of this operation, a latch operation is possible by this latch circuit which drives only NMOS transistors N12 and N14 by the reduced clock-swing signal CLK'.

Figure 4:
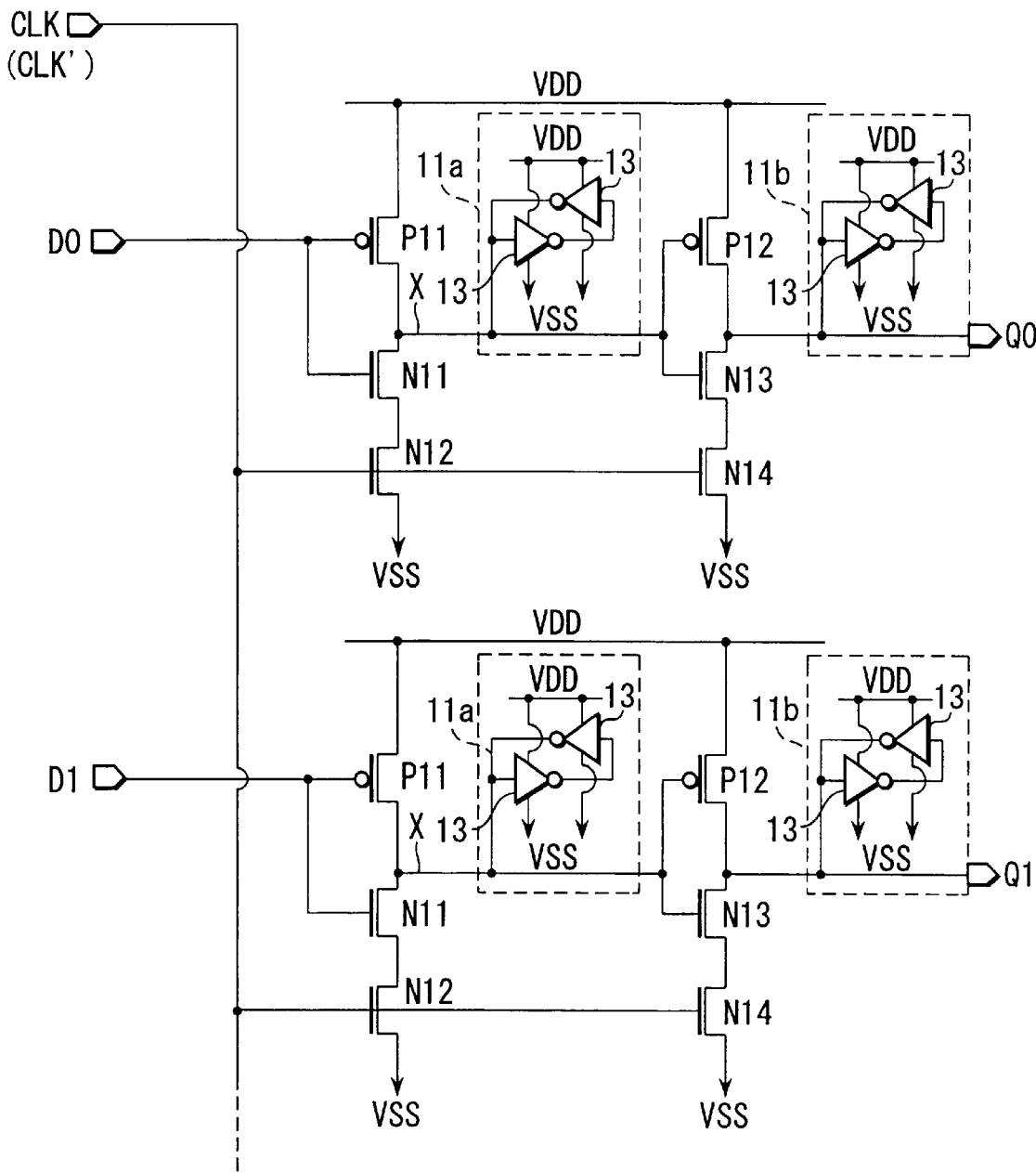
FIG. 4 shows a circuit diagram of a semiconductor holding device comprising a plurality of latch circuits which are common to a clock signal.

FIG. 4 shows a semiconductor holding device using a plurality of latch circuits corresponding to FIG. 1 and driven by the common clock signal CLK. Since two latch circuits are employed in the embodiment of FIG. 4, two data input signal D0 and D1 are necessary. It is possible to reduce the circuit scale by sharing the clock signal CLK in this way. The reduced clock-swing signal CLK' may be used instead of the clock signal CLK.

The Second Embodiment

Figure 5:
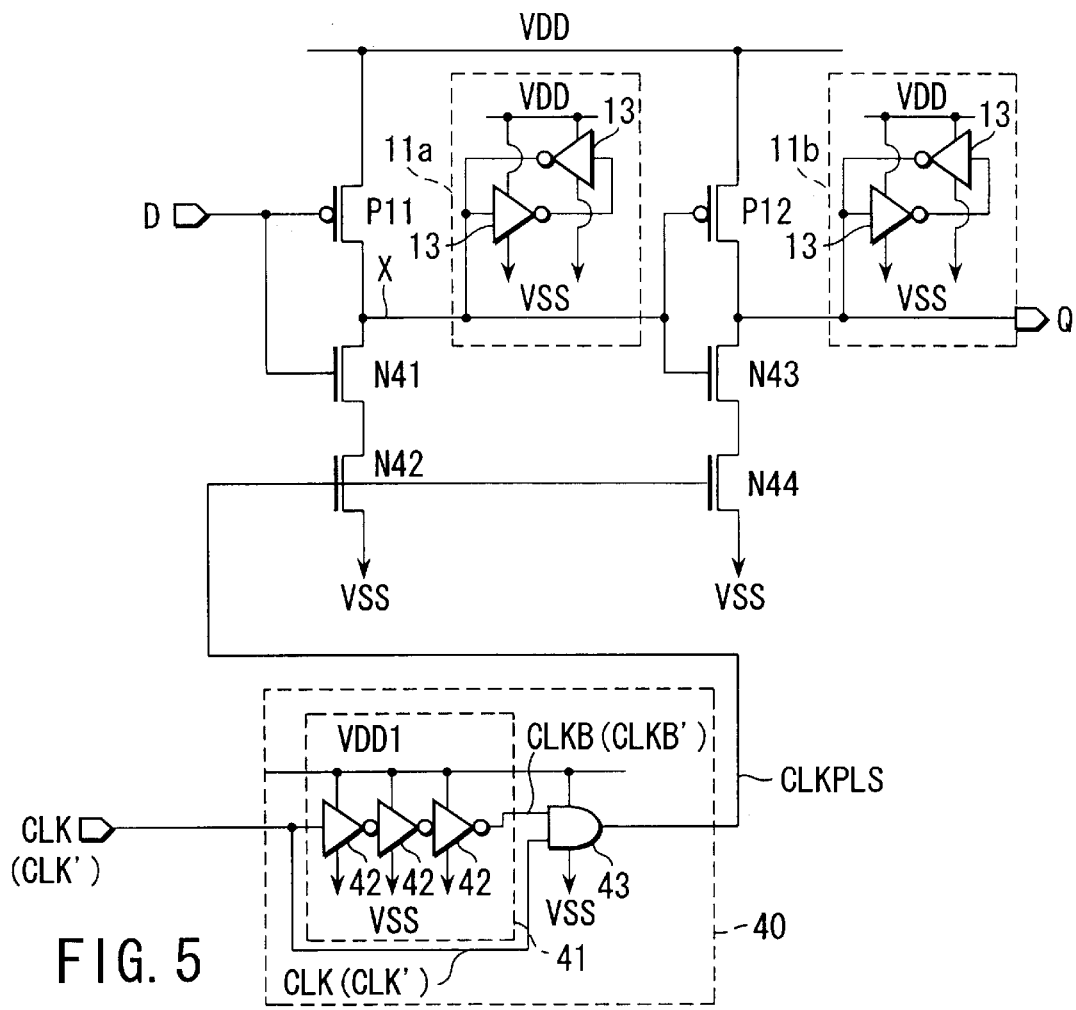
FIG. 5 shows a circuit diagram of a semiconductor holding device related to the second embodiment of the present invention.

FIG. 5 shows a configuration of a semiconductor holding device (flip-flop circuit) related to the second embodiment of the present invention. In this flip-flop circuit, a pulse generator 40 is provided in the pre-stage of the clock signal system of the latch circuit of FIG. 1. The supply voltages of this pulse generator 40 are VSS and VDD1. When the clock signal CLK of a usual swing is input as a clock signal, VDD1 VDD. When the reduced clock-swing signal CLK' is input as a clock signal, VDD1=VCK.

The pulse generator 40 comprises a delay block 41 including an odd number of inverter circuits 42 (three inverter circuits are illustrated in FIG. 5, but this number is arbitrary and may be one, if so desired) and a logical multiplication (AND)) circuit 43. The inverter circuit 42 and AND circuit 43 are logic gates operating with the supply voltage VDD1. The delay block 41 to which the clock signal CLK is supplied outputs a clock delay signal CLKB that is an inverted signal having a delay of three stage inverter circuits. When the reduced clock-swing signal CLK' is input to the delay block 41, the reduced-clock swing delay signal CLKB' is output from the delay block 41.

The case of reduced-clock swing is described as follows. Since the AND circuit 43 receives the reduced clock-swing signal CLK' and reduced-clock swing delay signal CLKB', it outputs a reduced-clock swing pulse signal CLKPLS of "1" during the delay time of the delay block 41 after the rising edge of the reduced clock-swing signal CLK'. The circuit of the present embodiment realizes a flip-flop circuit that is supplied with the reduced-clock swing pulse signal CLKPLS instead of the reduced clock-swing signal CLK' in the latch circuit of FIG. 1 and fetches data at the rising edge of the clock. Therefore, it is possible to comprise a flip-flop circuit operating with reduced-clock swing by using a pulse generator 40 operating with a reduced voltage source VCK (instead of VDD) in response to the reduced clock-swing signal CLK'.

Figure 6:
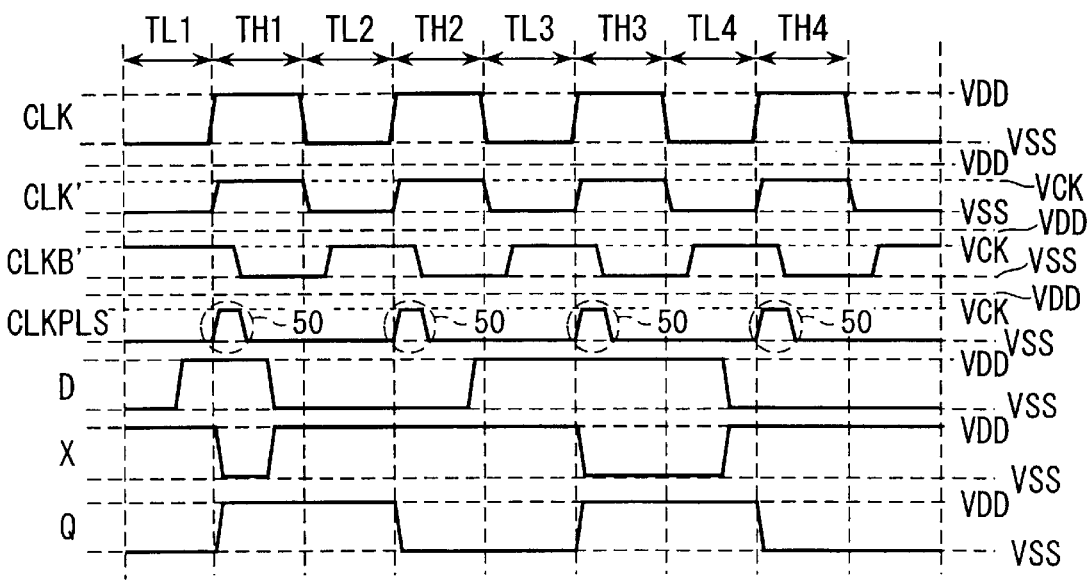
FIG. 6 shows a timing chart of operating the circuit of FIG. 5 with a reduced clock-swing signal CLK'.

FIG. 6 shows a timing chart of an operation of the flip-flop circuit shown in FIG. 5. The operation of the flip-flop circuit in conjunction with this timing chart will now be described in more detail. The reduced clock-swing signal CLK' and reduced-clock swing inverted signal CLKB' delayed from the clock signal CLK' by a delay of the delay block 41 are generated by the clock driver 40 and delay block 41. Since two clock signals CLK' and CLKB' are subjected to a logical multiplication by the AND circuit 43, the output signal CLKPLS becomes the reduced-clock swing pulse signal having a positive pulse 50 only at the time of CLK'= CLKB'=1 as shown in FIG. 6.

The data input signal D changes from 0 to 1 in the period TL1. However, since CLKPLS=0 in this time, the NMOS transistor N42 is rendered OFF. Since a path discharging charge on the node X is not formed in this time, the potentials of the node X and output node Q are held. The initial value of the output node Q is set on 0 in this operation. Since the data input signal D is 1 in the period of the positive pulse 50 generated in the period TH1, the NMOS transistors N41 and N42 are rendered ON simultaneously. As a result, the charge of the node X is discharged, and the node X changes from 1 to 0. Since the PMOS transistor P12 is rendered ON, the output node Q changes from 0 to 1. After falling of the pulse 50 in the period TH1, the data input signal D changes from 1 to 0 and thus the PMOS transistor P11 is rendered ON. Although the node X changes from 0 to 1, since the NMOS transistor N44 is rendered OFF, a path to discharge the charge on the output node Q is not formed. Therefore, the output node Q holds 1. Since the NMOS transistors N43 and N44 are rendered ON simultaneously in the period of the positive pulse 50 generated in the period TH2, the output node Q changes from 1 to 0. The data input signal D=0 in the period TH1 is fetched in this timing. The operation in periods TH2 to TH4 and TL2 to TL4 can be explained similarly to that in periods TH1, TH2 and TL1.

According to the present embodiment described above, the pulse generator supplied with the reduced clock-swing signal CLK' outputs the reduced-clock swing pulse signal CLKPLS. It is possible to operate the flip-flop circuit by driving only the NMOS transistor N42 and N44 by this pulse signal CLKPLS.

The Third Embodiment

Figure 7:
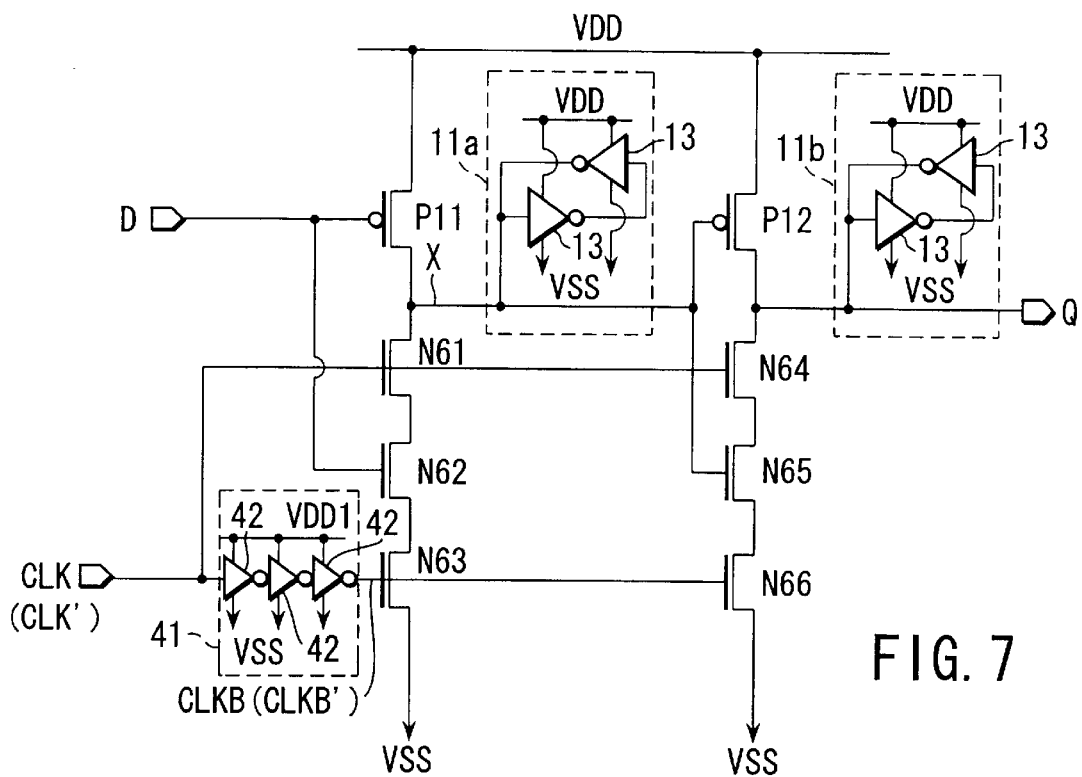
FIG. 7 shows a circuit diagram of a semiconductor holding device related to the third embodiment of the present invention.

FIG. 7 shows a configuration of a semiconductor holding device (flip-flop circuit) related to the third embodiment of the present invention. In this flip-flop circuit, the first stage comprises a PMOS transistor P11 and NMOS transistors N61 to N63 that are connected in series. The second stage comprises a PMOS transistor P12 and NMOS transistors N64 to N66 that are connected in series. This flip-flop circuit is supplied with the clock signal CLK and includes a delay block 41 comprising an odd number of inverter circuits 42 (three inverter circuits are illustrated, but this number is arbitrary and may be one, if so desired) and added to the latch circuit shown in FIG. 1. The NMOS transistors N63 and N66 are connected in series to discharge paths of the first and second stages of the latch circuit respectively. The clock delay signal CLKB corresponding to the output signal of the delay block 41 is input to the NMOS transistors N63 and N66. When the reduced clock-swing signal CLK' is input to the delay block 41, the delay block 41 outputs the reduced-clock swing delay signal CLKB'.

The reduced-clock swing will be explained as follows. In this configuration, the NMOS transistor N61, N63, N64 and N66 are rendered ON only when the reduced clock-swing signal CLK' and reduced-clock swing inverted signal CLKB' become "1" together. Therefore, in the same manner as the flip-flop circuit explained in FIG. 5, the data input signal D is fetched in the delay time determined by the delay block 41 from the rising edge of the clock signal. In other words, a flip-flop circuit can be realized. The flip-flop circuit that controls only the NMOS transistors by the reduced clock-swing signal can be realized by the above configuration.

The Fourth Embodiment

Figure 8:
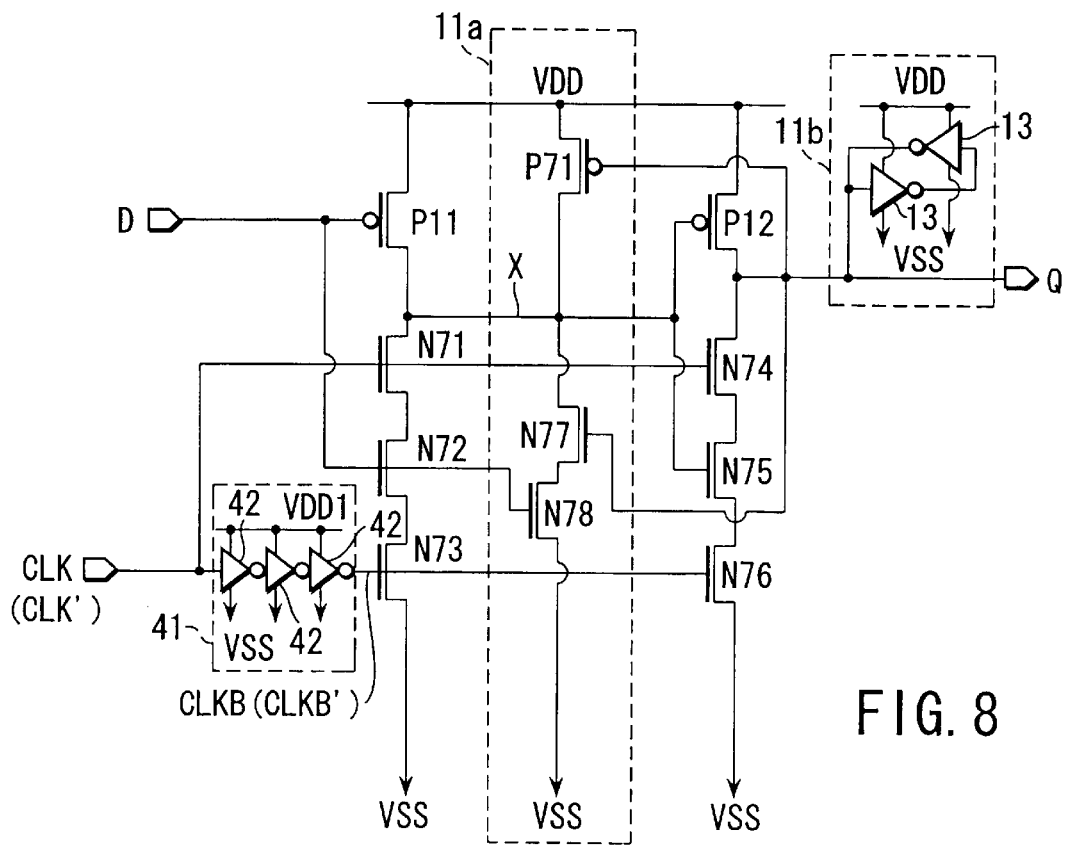
FIG. 8 shows a circuit diagram of a semiconductor holding device related to the fourth embodiment of the present invention.

FIG. 8 shows a configuration of a semiconductor holding device (flip-flop circuit) related to the fourth embodiment of the present invention. In this flip-flop circuit, the first stage comprises a PMOS transistor P11, and three NMOS transistors N71 to N73 that are connected in series. The second stage comprises a PMOS transistor and three NMOS transistors N74 to N76 that are connected in series. The clock signal CLK is supplied to the gates of the NMOS transistors N71 and N74. The clock delay signal CLKB of the delay block 41 is supplied to the gates of the NMOS transistors N73 and N76. The data input signal D is input to the gates of the PMOS transistor P11 and NMOS transistor N72.

A level holding circuit 11a for the node X comprises a PMOS transistor P71 and two NMOS transistors N77 and N78 that are connected in series. The PMOS transistor P71 includes a source and a drain connected to the power source VDD and node X respectively and a gate connected to the output node Q of the flip-flop circuit. The PMOS transistor P71 is connected in series between the node X and power source VDD. The NMOS transistors N77 and N78 include gates connected to the output node Q and the node for the data input signal D.

When the reduced clock-swing signal CLK' is input to the delay block 41, the delay block 41 outputs the reduced-clock swing delay signal CLKB'. The flip-flop is driven by the reduced-clock swing delay signal CLKB'.

The Fifth Embodiment

Figure 9:
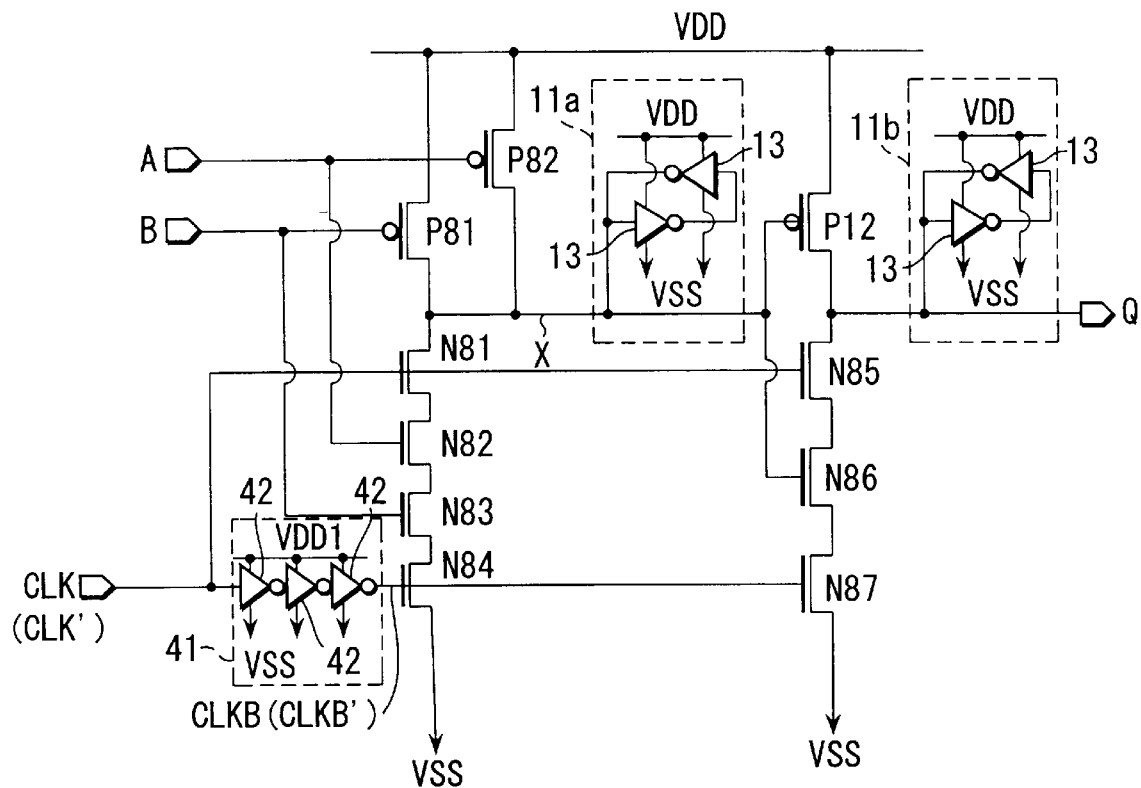
FIG. 9 shows a circuit diagram of a semiconductor holding device related to the fifth embodiment of the present invention.

FIG. 9 shows a configuration of the flip-flop circuit of the fifth embodiment of the present invention. This circuit introduces a logical operation circuit (2-input AND of data inputs A and B) into the flip-flop circuit of FIG. 7. In other words, the first logical operation circuit comprises PMOS transistors P81 and P82, and the second logical operation circuit comprises NMOS transistors N82 and N83. According to the flip-flop circuit that introduces the logical operation, it is possible to reduce the delay corresponding to logic gates.

The Sixth Embodiment

Figure 10:
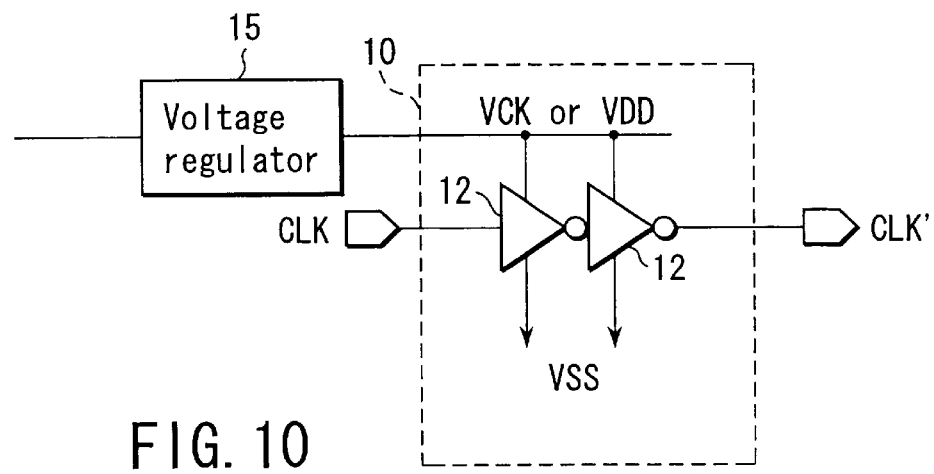
FIG. 10 shows a circuit diagram of a clock driver connected to a voltage regulator.

FIG. 10 shows a clock driver 10 connected to a voltage regulator 15 configured to regulate the supply voltage VCK. If the supply voltage of the clock driver 10 is regulated to VCK or VDD by the voltage regulator 15, the latch circuit shown in FIG. 1 can be operated by the reduced clock-swing signal CLK' or the full swing clock signal CLK. In other words, the latch circuit can be selectively driven in plural modes by the voltage regulation of the voltage regulator 15. The voltage regulator 15 may be applied to the flip-flop circuits shown in FIGS. 5, 7, 8 and 9 as well as the latch circuit shown in FIG. 4.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor holding device using a first power source and a second power source comprising:
    a first transistor circuit including a P type first transistor connected to the first power source, an N type second transistor connected to the first transistor and an N type third transistor connected between the second transistor and the second power source;

a second transistor circuit including a P type fourth transistor connected to the first power source, an N type fifth transistor connected to the fourth transistor and an N type sixth transistor connected between the fifth transistor and the second power source; and a clock generator which generates a clock signal to be supplied to gates of only the N type third and sixth transistors, an input signal being supplied to gates of the P type first transistor and the N type second transistor, a node of the first and second transistors being connected to gates of the fourth and fifth transistors, and a node of the fourth and fifth transistors as an output node, wherein the clock signal is not supplied to any P type transistor.

2. A semiconductor holding device according to claim 1, wherein the clock swing signal has a level lower than a swing between the first power source and the second power source.

3. A semiconductor holding device according to claim 2, wherein the clock generator comprises a third power source having a potential lower than that of the first power source and an inverter circuit using the third power source and the second power source as a voltage source.

4. A semiconductor holding device according to claim 1, further comprising a clock pulse generator supplied with the clock signal and configured to generate a clock pulse signal corresponding to the clock signal.

5. A semiconductor holding device according to claim 4, wherein the clock pulse generator includes a delay block making up an odd number of inverters connected in series and a gate circuit configured to perform logical multiplication on the clock signal and an output signal of the delay block.

6. A semiconductor holding device according to claim 1, further comprising a first level holding device configured to hold the node of the first and second transistors at a potential of the first power source or a potential of the second power source, and a second level holding device configured to hold the output node at a potential of the first power source or a potential of the second power source.

7. A semiconductor holding device according to claim 6, wherein each of the first and the second level holding devices includes first and second inverters using the first and second power supplies as a source voltage, an output node of the first inverter serving as a gate input of the second inverter, and an output node of the second inverter serving as an input of the first inventor.

8. A semiconductor holding device according to claim 6, wherein the first level holding device comprises a transistor connected to the first power source and a node of the first and second transistors, and having a gate connected to the output node, and two transistors connected in series between the node of the first and second transistors and the second power source, one of the two transistors having a gate supplied with the input signal, and the other having a gate connected to the output node.

9. A semiconductor holding device according to claim 1, wherein the first transistor and the second transistor forms a logical operation unit.

10. A semiconductor holding device according to claim 1, wherein the clock generator generates selectively a reduced clock signal and a full clock signal to supply one of them to the gates of the N type third and sixth transistors.

11. A semiconductor holding device according to claim 9, wherein the logic operation unit comprises a plurality of PMOS transistors and a plurality of NMOS transistors.

12. A semiconductor holding device using a first power source and a second power source, comprising:

a clock generator configured to generate a clock signal;

a delay block including an odd number of inverter elements, the clock signal being supplied to the delay block to generate a delay clock signal of the same swing as the clock signal;

a first transistor circuit including a P type first transistor connected to the first power source, an N type second transistor connected to the first transistor, an N type third transistor connected to the second transistor and an N type fourth transistor connected between the third transistor and the second power source; and a second transistor circuit including a P type fifth transistor connected to the first power source, an N type sixth transistor connected to the fifth transistor, an N type seventh transistor connected to the sixth transistor, and an N type eighth transistor connected between the seventh transistor and the second power source, an input signal being supplied to gates of the N type second and sixth transistors, the delay clock signal being supplied to gates of only the fourth and eighth transistors, a node of the first and second transistors being connected to gates of the fifth and the seventh transistors and a node of the fifth and sixth transistors serving as an output node, wherein the clock signal is not supplied to any P type transistor.

13. A semiconductor holding device according to claim 12, wherein the clock swing signal has a level lower than a swing between the first power source and the second power source.

14. A semiconductor holding device according to claim 12, wherein the clock generator comprises a third power source having a potential lower than that of the first power source and an inverter circuit using the third power source and the second power source as a voltage source.

15. A semiconductor holding device according to claim 12, further comprising a first level holding device configured to hold the node of the first and second transistors at a potential of the first power source or a potential of the second power source, and a second level holding device configured to hold the output node at a potential of the first power source or a potential of the second power source.

16. A semiconductor holding device according to claim 15, wherein each of the first and the second level holding devices includes a first and second inverters using the first and second power supplies as a source voltage, an output node of the first inverter serving as a gate input of the second inverter, and an output node of the second inverter serving as an input of the first inverter.

17. A semiconductor holding device according to claim 15, wherein the first level holding device comprises a transistor connected to the first power source and the node of the first and second transistors, and having a gate connected to the output node, and two transistors connected in series between the node of the first and second transistors and the second power source, one of the two transistors having a gate supplied with the input signal, and the other having a gate connected to the output node.

18. A semiconductor holding device according to claim 12, wherein the first transistor and the second transistor form a logical operation unit including the first transistor.

19. A semiconductor holding device according to claim 12, wherein the clock generator generates selectively a reduced clock signal and a full signal to supply one of them to the gates of the N type third and sixth transistors.

20. A semiconductor holding device according to claim 18, wherein the logic operation unit comprises a plurality of PMOS transistors and a plurality of NMOS transistors.

* * * * *